(12) United States Patent
Wu

(10) Patent No.: US 9,608,044 B2
(45) Date of Patent: Mar. 28, 2017

(54) OLED DISPLAY PANEL, METHOD FOR MANUFACTURING THE SAME, DISPLAY DEVICE AND ELECTRONIC PRODUCT

(71) Applicant: BOE TECHNOLOGY GROUP CO., LTD., Beijing (CN)

(72) Inventor: Changyen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 128 days.

(21) Appl. No.: 14/405,293

(22) PCT Filed: Mar. 27, 2014

(86) PCT No.: PCT/CN2014/074155
§ 371 (c)(1),
(2) Date: Dec. 3, 2014

(87) PCT Pub. No.: WO2015/085681
PCT Pub. Date: Jun. 18, 2015

(65) Prior Publication Data
US 2016/0268351 A1 Sep. 15, 2016

(30) Foreign Application Priority Data
Dec. 10, 2013 (CN) .......................... 2013 1 0669698

(51) Int. Cl.
*H01L 27/32* (2006.01)
*H01L 51/50* (2006.01)
(Continued)

(52) U.S. Cl.
CPC ...... *H01L 27/3211* (2013.01); *H01L 27/3209* (2013.01); *H01L 51/5004* (2013.01);
(Continued)

(58) Field of Classification Search
CPC ......... H01L 27/32; H01L 51/52; H01L 51/56; H01L 51/50
(Continued)

(56) References Cited

U.S. PATENT DOCUMENTS

2006/0238119 A1 10/2006 Spindler
2007/0046185 A1* 3/2007 Kim .............................. 313/504
(Continued)

FOREIGN PATENT DOCUMENTS

| CN | 102856507 A | 1/2013 |
| CN | 103779387 A | 5/2014 |
| JP | 2011048962 A | 3/2011 |

OTHER PUBLICATIONS

Written Opinion of the International Searching Authority for international application No. PCT/CN2014/074155.
(Continued)

*Primary Examiner* — Sheng Zhu
(74) *Attorney, Agent, or Firm* — Harness, Dickey & Pierce, P.L.C.

(57) ABSTRACT

The present disclosure provides an OLED display panel, which sequentially includes: a first light emitting layer covering at least two adjacent sub-pixels including the first sub-pixel; a charge blocking layer covering the second sub-pixel and the third sub-pixel; a second light emitting layer covering the first sub-pixel and the second sub-pixel; a third light emitting layer covering at least two adjacent sub-pixels including the third sub-pixel. LUMO energy levels of a main material of the charge blocking layer, a main light emitting material of the third light emitting layer, a main light emitting material of the second light emitting layer and a main light emitting material of the first light emitting layer are sequentially decreased; or, HOMO energy levels of the main light emitting materials of the first light
(Continued)

emitting layer, the second light emitting layer, the third light emitting layer and the charge blocking layer are sequentially decreased.

18 Claims, 3 Drawing Sheets

(51) Int. Cl.
*H01L 51/52* (2006.01)
*H01L 51/56* (2006.01)

(52) U.S. Cl.
CPC ........ *H01L 51/504* (2013.01); *H01L 51/5044* (2013.01); *H01L 51/5206* (2013.01); *H01L 51/5221* (2013.01); *H01L 51/56* (2013.01); *H01L 2251/308* (2013.01); *H01L 2251/552* (2013.01)

(58) Field of Classification Search
USPC .................. 257/40, 89; 313/506; 438/35, 99
See application file for complete search history.

(56) References Cited

U.S. PATENT DOCUMENTS

| | | |
|---|---|---|
| 2007/0046195 A1 | 3/2007 | Chin et al. |
| 2008/0238300 A1* | 10/2008 | Park et al. .................... 313/504 |
| 2010/0090241 A1* | 4/2010 | D'Andrade et al. ............ 257/98 |
| 2013/0140533 A1* | 6/2013 | Lee et al. ......................... 257/40 |
| 2013/0153881 A1* | 6/2013 | Tokoo et al. .................... 257/40 |

OTHER PUBLICATIONS

Chinese Office Action dated Jan. 29, 2015 regarding Application No. 201310669698.1, filed Dec. 10, 2013. Translation provided by Dragon Intellectual Property Law Firm.

* cited by examiner ated sequence of sub-pixels inconsistent, resulting in jagged images in which lines are not continued when a screen is displayed.

OLED DISPLAY PANEL, METHOD FOR MANUFACTURING THE SAME, DISPLAY DEVICE AND ELECTRONIC PRODUCT

CROSS-REFERENCE TO RELATED APPLICATION

This application is the U.S. national phase of PCT Application No. PCT/CN2014/074155 filed on Mar. 27, 2014, which claims priority to Chinese Patent Application No. 201310669698.1 filed on Dec. 10, 2013, the disclosures of each are incorporated in their entirety by reference herein.

TECHNICAL FIELD

The present disclosure relates to the field of display technology, in particular to an OLED display panel, a method for manufacturing the same, a display device and an electronic product.

BACKGROUND

An organic light emitting device (OLED) is a display device emitting light by use of an electroluminescent phosphor or an organic phosphor. The OLED drives a plurality of organic light emitting diodes to display an image, the organic light emitting diode includes an anode, an organic thin layer and a cathode. The organic thin layer usually has a multilayer structure including a light emitting layer (EML), an electron transport layer (ETL) and a hole transport layer (HTL), to improve the balance between electrons and holes, thereby improving luminescent efficiency. The multilayer structure may further include an electron injection layer (EIL) and a hole injection layer (HIL).

In an OLED, in order to display full-colors, red (R), green (G) and blue (B) light emitting layers may be patterned respectively. In order to pattern the light emitting layer, a shadow mask may be used in a case of a small-molecule OLED, and an inkjet printing method or a laser induced thermal imaging (LITI) method may be used in a case of a polymer OLED. By the LITI method, an organic layer may be finely patterned. The LITI method may be used for a large area, and an advantage of LITI method is a high resolution. A display with high pixels per inch (PPI) is a major trend of the current display device. In the existing OLED mass production technology, a fine metal mask (FMM) and a RGB side by side method is mainly used to achieve the full-color display of OLEDs. However, it is difficult to control the accuracy of FMM, so that it is difficult to achieve a high PPI OLED. In order to increase the density of pixels, in the related art there are mainly two solutions as follows.

1. As shown in FIG. 1, firstly, light emitting layers of sub-pixels of two colors, for example, R and G, are made simultaneously; then by using different optical thicknesses of the light emitting layers of the two sub-pixels, one of the colors, for example, R or G, is extracted by a micro-cavity effect; after that, when making a light emitting layer of a third color sub-pixel, the light emitting layer of the third color for example, B, may be formed in the entire pixel region. However, the OLED made in this manner, along with the perspective being changed, a color cast is very serious, and the luminescent efficiency of the light emitting layers of the two colors manufactured simultaneously may also be decreased.

2. As shown in FIG. 2, light emitting layers of same color sub-pixels in different pixels are deposited simultaneously by a FMM method with a larger opening. However, such manner may cause an arrangement sequence of sub-pixels inconsistent, resulting in jagged images in which lines are not continued when a screen is displayed.

SUMMARY

One technical problem to be solved by the present disclosure is to provide an OLED display panel, a method for manufacturing the same, a display device and an electronic product, which can enhance a pixel density of an OLED display panel without changing the FMM accuracy.

To solve the above technical problem, one embodiment of the present disclosure provides technical solutions as follows.

On one aspect, an OLED display panel is provided. One pixel of the OLED display panel includes a first sub-pixel, a second sub-pixel and a third sub-pixel displaying different colors. The OLED display panel sequentially includes:
a first light emitting layer covering at least two adjacent sub-pixels including the first sub-pixel;
a charge blocking layer covering the second sub-pixel and the third sub-pixel;
a second light emitting layer covering the first sub-pixel and the second sub-pixel;
a third light emitting layer covering at least two adjacent sub-pixels including the third sub-pixel;
wherein LUMO energy levels of a main material of the charge blocking layer, a main light emitting material of the third light emitting layer, a main light emitting material of the second light emitting layer and a main light emitting material of the first light emitting layer are sequentially decreased; HOMO energy levels of the main light emitting material of the first light emitting layer, the main light emitting material of the second light emitting layer, the main light emitting material of the third light emitting layer and the main material of the charge blocking layer are sequentially decreased.

Further, the OLED display panel sequentially includes:
the first light emitting layer covering the entire pixel;
the charge blocking layer covering the second sub-pixel and the third sub-pixel;
the second light emitting layer covering the first sub-pixel and the second sub-pixel;
the third light emitting layer covering the entire pixel.

Further, the OLED display panel sequentially includes:
the first light emitting layer covering the entire pixel;
the charge blocking layer covering the second sub-pixel and the third sub-pixel;
the second light emitting layer covering the first sub-pixel and the second sub-pixel;
the third light emitting layer covering the second sub-pixel and the third sub-pixel.

Further, the OLED display panel sequentially includes:
the first light emitting layer covering the first sub-pixel and the second sub-pixel;
the charge blocking layer covering the second sub-pixel and the third sub-pixel;
the second light emitting layer covering the first sub-pixel and the second sub-pixel;
the third light emitting layer covering the second sub-pixel and the third sub-pixel.

Further, the OLED display panel sequentially includes:
the first light emitting layer covering the first sub-pixel and the second sub-pixel;
the charge blocking layer covering the second sub-pixel and the third sub-pixel;

the second light emitting layer covering the first sub-pixel and the second sub-pixel;

the third light emitting layer covering the entire pixel.

Further, the OLED display panel includes:

a semi-transparent anode layer;

a hole transport layer on the semi-transparent anode layer;

the first light emitting layer on the hole transport layer;

the charge blocking layer on the first light emitting layer;

the second light emitting layer on the charge blocking layer;

the third light emitting layer on the second light emitting layer;

an electron transport layer on the third light emitting layer;

a metal cathode layer on the electron transport layer.

Further, the OLED display panel includes:

a semi-transparent anode layer;

a hole transport layer on the semi-transparent anode layer;

the third light emitting layer on the hole transport layer;

the second light emitting layer on the third light emitting layer;

the charge blocking layer on the second light emitting layer;

the first light emitting layer on the charge blocking layer;

an electron transport layer on the first light emitting layer;

a metal cathode layer on the electron transport layer.

One embodiment of the present disclosure further provides a display device including the OLED display panel described above.

One embodiment of the present disclosure further provides a method for manufacturing an OLED display panel, one pixel of the OLED display panel including a first sub-pixel, a second sub-pixel and a third sub-pixel displaying different colors respectively, wherein the method includes:

forming a first light emitting layer covering at least two adjacent sub-pixels including the first sub-pixel;

forming a charge blocking layer covering the second sub-pixel and the third sub-pixel;

forming a second light emitting layer covering the first sub-pixel and the second sub-pixel;

forming a third light emitting layer covering at least two adjacent sub-pixels including the third sub-pixel;

wherein LUMO energy levels of a main material of the charge blocking layer, a main light emitting material of the third light emitting layer, a main light emitting material of the second light emitting layer and a main light emitting material of the first light emitting layer are sequentially decreased; HOMO energy levels of the main light emitting material of the first light emitting layer, the main light emitting material of the second light emitting layer, the main light emitting material of the third light emitting layer and the main material of the charge blocking layer are sequentially decreased.

Further, the method includes:

forming a semi-transparent anode layer;

forming a hole transport layer on the semi-transparent anode layer;

forming the first light emitting layer on the hole transport layer;

forming the charge blocking layer on the first light emitting layer;

forming the second light emitting layer on the charge blocking layer;

forming the third light emitting layer on the second light emitting layer;

forming an electron transport layer on the third light emitting layer;

forming a metal cathode layer on the electron transport layer.

Further, the manufacturing method includes:

forming a semi-transparent anode layer;

forming a hole transport layer on the semi-transparent anode layer;

forming the third light emitting layer on the hole transport layer;

forming the second light emitting layer on the third light emitting layer;

forming the charge blocking layer on the second light emitting layer;

forming the first light emitting layer on the charge blocking layer;

forming an electron transport layer on the first light emitting layer;

forming a metal cathode layer on the electron transport layer.

One embodiment of the present disclosure further provides an electronic product including the display device described above.

One embodiment of the present disclosure has the following advantageous effects:

In the above solutions, each of the first light emitting layer, the charge blocking layer, the second light emitting layer and the third light emitting layer covers at least two sub-pixels, so that when the light emitting layer is manufactured by using FMM, a minimum opening of the FMM may be at least as large as two sub-pixel regions, thereby enhancing the pixel density of the OLED display panel without changing the FMM. Further, the OLED display panel according to one embodiment of the present disclosure does not rely on an optical effect to extract light of a certain color, so that the luminescent efficiency is not lost, and a color cast problem is not occurred. The OLED display panel according to one embodiment of the present disclosure does not need to change the arrangement sequence of sub-pixels, and thus the screen display is not affected.

DETAILED DESCRIPTION

Figure 1:
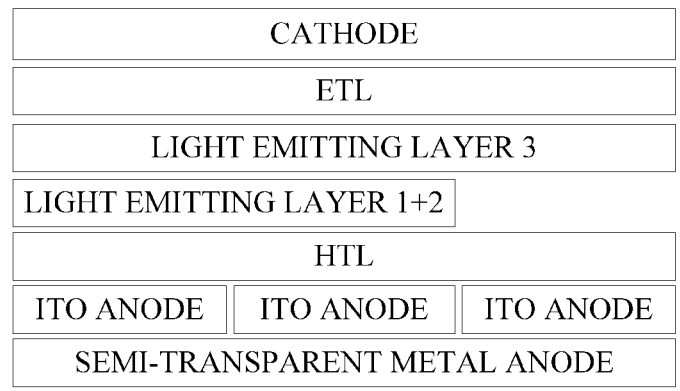
FIG. 1 is a schematic diagram showing an OLED display panel in the related art.
Figure 2:
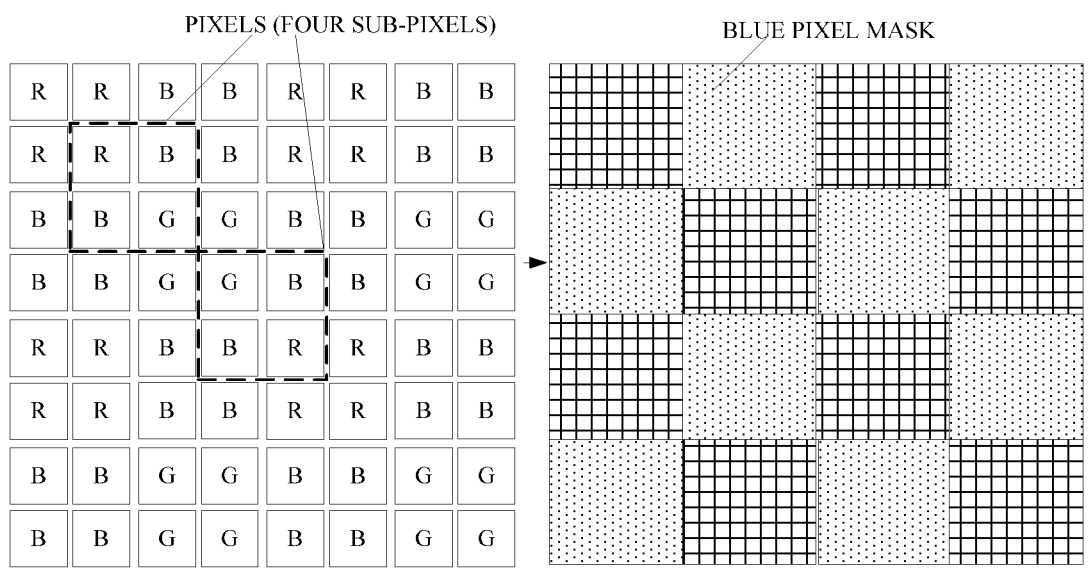
FIG. 2 is a schematic diagram showing manufacturing a light emitting layer by using FMM with a large opening in the related art.

In order to make the technical problem to be solved, the technical solutions and the advantages of embodiments of the present disclosure more clear, descriptions in detail will be given below in conjunction with the accompanying drawings and embodiments.

One embodiment of the present disclosure provides an OLED display panel, a method for manufacturing the same, a display device and an electronic product, which may enhance a pixel density of an OLED display panel without changing the FMM accuracy.

One embodiment of the present disclosure provides an OLED display panel. One pixel of the OLED display panel includes a first sub-pixel, a second sub-pixel and a third sub-pixel displaying different colors. The OLED display panel sequentially includes:

a first light emitting layer covering at least two adjacent sub-pixels including the first sub-pixel;

a charge blocking layer covering the second sub-pixel and the third sub-pixel;

a second light emitting layer covering the first sub-pixel and the second sub-pixel;

a third light emitting layer covering at least two adjacent sub-pixels including the third sub-pixel.

The lowest unoccupied molecular orbital (LUMO) (note: an orbital unoccupied by an electron with the lowest energy level is referred as the lowest unoccupied orbital) energy levels of a main material of the charge blocking layer, a main light emitting material of the third light emitting layer, a main light emitting material of the second light emitting layer and a main light emitting material of the first light emitting layer are sequentially decreased; or, the highest occupied molecular orbital (HOMO) (note: an orbital occupied by an electron with the highest energy level is referred as the highest occupied orbital) energy levels of the main light emitting material of the first light emitting layer, the main light emitting material of the second light emitting layer, the main light emitting material of the third light emitting layer and the main material of the charge blocking layer are sequentially decreased.

In the OLED display panel according to one embodiment of the present disclosure, each of the first light emitting layer, the charge blocking layer, the second light emitting layer and the third light emitting layer covers at least two sub-pixels, so that when the light emitting layer is manufactured by using FMM, a minimum opening of the FMM may be at least as large as two sub-pixel regions, thereby enhancing the pixel density of the OLED display panel without changing the FMM. Further, the OLED display panel according to one embodiment of the present disclosure does not rely on an optical effect to extract light of a certain color, so that the luminescent efficiency is not lost, and a color cast problem is also not occurred. The OLED display panel according to one embodiment of the present disclosure does not need to change the arrangement sequence of sub-pixels, and the screen display is not affected.

Specifically, in one embodiment of the present disclosure, the OLED display panel may sequentially include:

the first light emitting layer covering the entire pixel;

the charge blocking layer covering the second sub-pixel and the third sub-pixel;

the second light emitting layer covering the first sub-pixel and the second sub-pixel;

the third light emitting layer covering the entire pixel.

Specifically, in one embodiment of the present disclosure, the OLED display panel may sequentially include:

the first light emitting layer covering the entire pixel;

the charge blocking layer covering the second sub-pixel and the third sub-pixel;

the second light emitting layer covering the first sub-pixel and the second sub-pixel;

the third light emitting layer covering the second sub-pixel and the third sub-pixel.

Specifically, in one embodiment of the present disclosure, the OLED display panel may sequentially include:

the first light emitting layer covering the first sub-pixel and the second sub-pixel;

the charge blocking layer covering the second sub-pixel and the third sub-pixel;

the second light emitting layer covering the first sub-pixel and the second sub-pixel;

the third light emitting layer covering the second sub-pixel and the third sub-pixel Specifically, in one embodiment of the present disclosure, the OLED display panel may sequentially include:

the first light emitting layer covering the first sub-pixel and the second sub-pixel;

the charge blocking layer covering the second sub-pixel and the third sub-pixel;

the second light emitting layer covering the first sub-pixel and the second sub-pixel;

the third light emitting layer covering the entire pixel.

Further, in one embodiment of the present disclosure, the OLED display panel may specifically include:

a semi-transparent anode layer;

a hole transport layer on the semi-transparent anode layer;

the first light emitting layer on the hole transport layer;

the charge blocking layer on the first light emitting layer;

the second light emitting layer on the charge blocking layer;

the third light emitting layer on the second light emitting layer;

an electron transport layer on the third light emitting layer;

a metal cathode layer on the electron transport layer.

Further, in one embodiment of the present disclosure, the OLED display panel may specifically include:

the semi-transparent anode layer;

the hole transport layer on the semi-transparent anode layer;

the third light emitting layer on the hole transport layer;

the second light emitting layer on the third light emitting layer;

the charge blocking layer on the second light emitting layer;

the first light emitting layer on the charge blocking layer;

the electron transport layer on the first light emitting layer;

the metal cathode layer on the electron transport layer.

It should be noted that, in the above-described optional embodiment, the anode layer is set to be made of a semi-transparent material (e.g., indium tin oxide (ITO)) while the cathode layer is made of a metal, however, the embodiment of the present disclosure is not limited thereto. It should also be understood by those skilled in the art that the anode layer may be made of a metal and the cathode layer may be made of an ITO. Further, the following embodiment takes an example in which three sub-pixels are provided with anodes separately and share one cathode for illustration. However, those skilled in the art should understand that as an alternative, the three sub-pixels may share one anode and use separate cathodes for their own.

One embodiment of the present disclosure further provides a display device, including the OLED display panel as described above. The structure and the working principle of the OLED display panel are as same as that in the above-described embodiment which will be omitted here. Further, the structure of the rest of the display device may refer to the related art, which will not be described in detail herein. The display device may be a product or component having any display function, such as an electronic paper, a TV, a monitor, a digital photo frame, a mobile phone, a tablet computer and the like.

One embodiment of the present disclosure also provides a method for manufacturing an OLED display panel. One pixel of the OLED display panel includes a first sub-pixel, a second sub-pixel and a third sub-pixel displaying different colors. The manufacturing method includes:

forming a first light emitting layer covering at least two adjacent sub-pixels including the first sub-pixel;

forming a charge blocking layer covering the second sub-pixel and the third sub-pixel;

forming a second light emitting layer covering the first sub-pixel and the second sub-pixel;

forming a third light emitting layer covering at least two adjacent sub-pixels including the third sub-pixel.

Energy levels of LUMOs of a main material of the charge blocking layer, a main light emitting material of the third light emitting layer, a main light emitting material of the second light emitting layer and a main light emitting material of the first light emitting layer are sequentially decreased; or, energy levels of HOMOs of the main light emitting material of the first light emitting layer, the main light emitting material of the second light emitting layer, the main light emitting material of the third light emitting layer and the main material of the charge blocking layer are sequentially decreased.

In the OLED display panel manufactured according to one embodiment of the present disclosure, each of the first light emitting layer, the charge blocking layer, the second light emitting layer and the third light emitting layer covers at least two sub-pixels, so that when the light emitting layer is manufactured by using FMM, a minimum opening of the FMM may be at least as large as two sub-pixel regions, thereby enhancing the pixel density of the OLED display panel without changing the FMM. Further, the OLED display panel according to one embodiment of the present disclosure does not rely on an optical effect to extract light of a certain color, so that the luminescent efficiency is not lost, and a color cast problem is not occurred. The OLED display panel according to one embodiment of the present disclosure does not need to change the arrangement sequence of sub-pixels, and thus the screen display is not affected.

Further, in one embodiment of the present disclosure, the method may specifically include:

forming a semi-transparent anode layer;

forming a hole transport layer on the semi-transparent anode layer;

forming the first light emitting layer on the hole transport layer;

forming the charge blocking layer on the first light emitting layer;

forming the second light emitting layer on the charge blocking layer;

forming the third light emitting layer on the second light emitting layer;

forming an electron transport layer on the third light emitting layer;

forming a metal cathode layer on the electron transport layer.

Further, in one embodiment of the present disclosure, the method may specifically include:

forming the semi-transparent anode layer;

forming the hole transport layer on the semi-transparent anode layer;

forming the third light emitting layer on the hole transport layer;

forming the second light emitting layer on the third light emitting layer;

forming the charge blocking layer on the second light emitting layer;

forming the first light emitting layer on the charge blocking layer;

forming the electron transport layer on the first light emitting layer;

forming the metal cathode layer on the electron transport layer.

On the other hand, one embodiment of the present disclosure also provides an electronic product, including the display device described above. The structure and the working principle of the electronic product are as same as the above-described embodiment, which will be omitted here. Further, the structure of the rest of the electronic product may refer to the related art, which will not be described in detail herein. The electronic product may be a product or a component having any display function, such as a home appliance, a communication equipment, an engineering equipment, an electronic entertainment product and the like.

The OLED display panel and the method for manufacturing the same according to the present disclosure will be described in detail hereinafter in conjunction with the specific embodiments.

Embodiment One

In an OLED display panel according to one embodiment of the present disclosure, one pixel of the OLED display panel includes a first sub-pixel displaying red, a second sub-pixel displaying green and a third sub-pixel displaying blue. The OLED display panel sequentially includes:

a first light emitting layer (EML1) covering at least two adjacent sub-pixels including the first sub-pixel and configured to emit red light;

a charge blocking layer (CBL) covering the second sub-pixel and the third sub-pixel;

a second light emitting layer (EML2) covering the first sub-pixel and the second sub-pixel and configured to emit green light;

a third light emitting layer (EML3) covering at least two adjacent sub-pixels including the third sub-pixel and configured to emit blue light.

Figure 3:
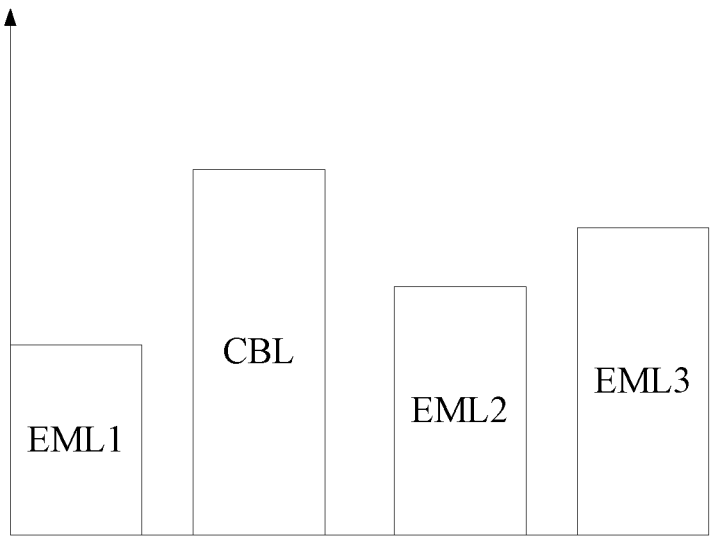
FIG. 3 is a schematic diagram showing LUMO energy levels of each of light emitting layers and a charge blocking layer according to a first embodiment of the present disclosure.

FIG. 3 is a diagram showing the LUMO energy levels of each light emitting layer and the charge blocking layer according to the first embodiment of the present disclosure. An arrow direction in FIG. 3 indicates an absolute value of the energy level. Specifically, the LUMO energy levels of the first light emitting layer, the second light emitting layer, the third light emitting layer and the charge blocking layer are all negative; the LUMO energy level of the first light emitting layer is lower than that of the second light emitting layer, the LUMO energy level of the second light emitting layer is lower than that of the third light emitting layer, the LUMO energy level of the third light emitting layer is lower than that of the charge blocking layer.

Figure 4:
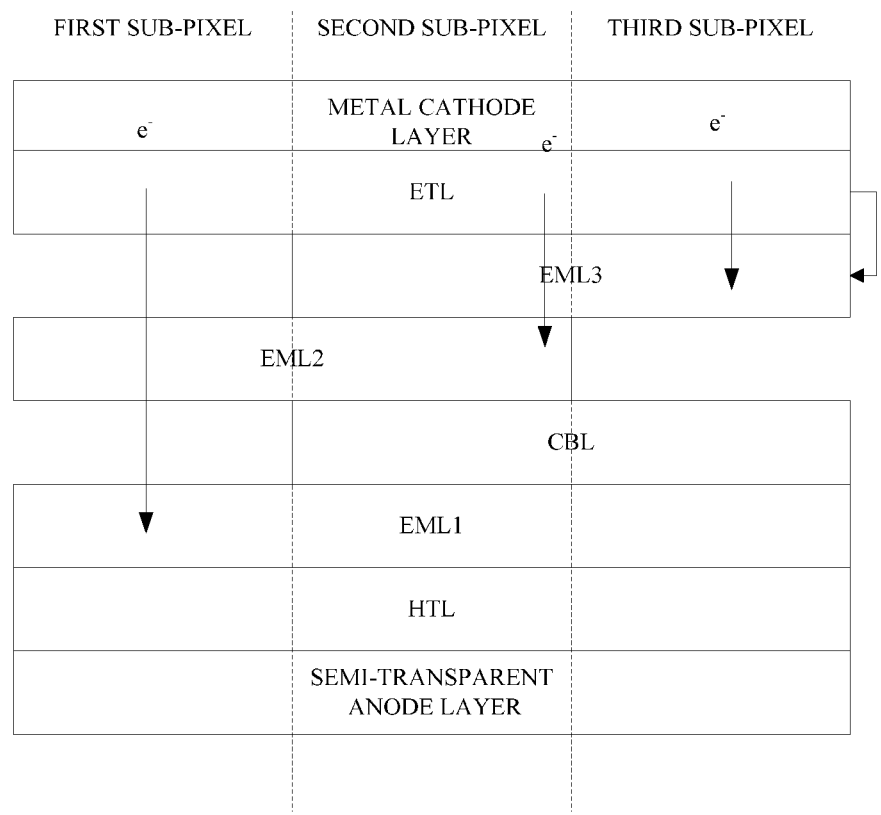
FIG. 4 is a schematic diagram showing an OLED display panel according to the first embodiment of the present disclosure.

Specifically, as shown in FIG. 4, the OLED display panel may include:

a semi-transparent anode layer;

a hole transport layer on the semi-transparent anode layer;

a light emitting layer covering the entire pixel;

a charge blocking layer covering the second sub-pixel and the third sub-pixel;

a second light emitting layer covering the first sub-pixel and the second sub-pixel;

a third light emitting layer covering the second sub-pixel and the third sub-pixel;

an electron transport layer on the third light emitting layer;

a metal cathode layer on the electron transport layer.

Specifically, a method for manufacturing an OLED display panel according to one embodiment of the present disclosure includes following steps of:

forming the semi-transparent anode layer;

forming the hole transport layer on the semi-transparent anode layer;

forming the first light emitting layer on the hole transport layer;

forming the charge blocking layer on the first light emitting layer;

forming the second light emitting layer on the charge blocking layer;

forming the third light emitting layer on the second light emitting layer;

forming the electron transport layer on the third light emitting layer;

forming the metal cathode layer on the electron transport layer.

In the OLED display panel, since the light emitting layer is very thin, electrons are more likely to move in a direction from the cathode layer to the anode layer, and are not likely to move transversely in a direction perpendicular to an electric field. Electrons are readily to jump from one light emitting layer with a higher LUMO energy level to one light emitting layer with a lower LUMO energy level, and are difficult to jump from one light emitting layer with a lower LUMO energy level to one light emitting layer with a higher LUMO energy level. When an electron remains in one light emitting layer and encounters with a hole, an exciton is formed and light is emitted. According to the above principle, in the OLED display panel shown in FIG. 4, for the first sub-pixel region, the electrons start from the cathode layer. Since the LUMO energy level of the EML2 is higher than that of the EML1, thus the electrons may pass through the EML2 to reach EML1, but cannot pass through HTL. The electrons stay in the EML1 to excite the EML1 to emit red light, so that the first sub-pixel displays red light. For the second sub-pixel region, since the LUMO energy level of the EML3 is higher than that of the EML2 and the LUMO energy level of the CBL is higher than that of the EML2, thus, the electrons may pass through the EML3 to reach EML2, but cannot pass through the CBL, electrons stay in the EML2 to excite the EML2 to emit green light, so that the second sub-pixel displays green light. For the third sub-pixel region, since the LUMO energy level of the EML3 is lower than that of the CBL, thus, the electrons cannot pass through the CBL, the electrons stay in the EML3 to excite the EML3 to emit blue light, so that the third sub-pixel displays blue light.

When an OLED display panel is manufactured by using FMM in the related art, generally, one FMM opening corresponds to one sub-pixel region, since the accuracy of FMM is limited, thus the pixel density of the OLED display panel is also limited. In the OLED display panel according to one embodiment of the present disclosure, each of the first light emitting layer, the charge blocking layer, the second light emitting layer and the third light emitting layer covers at least two sub-pixels, so that when the light emitting layer is manufactured by using FMM, a minimum opening of the FMM may be at least as large as two sub-pixel regions, thereby enhancing the pixel density of the OLED display panel by twice without changing the FMM. Further, the OLED display panel according to one embodiment of the present disclosure does not rely on an optical effect to extract light of a certain color, so that the luminescent efficiency is not lost, and a color cast problem is not occurred. The OLED display panel according to one embodiment of the present disclosure does not need to change the arrangement sequence of sub-pixels, and thus the screen display is not affected.

Further, the OLED display panel according to one embodiment of the present disclosure is not limited to the structure shown in FIG. 4, instead of covering the entire pixel, the first light emitting layer may also cover only the first sub-pixel and the second sub-pixel; instead of covering the second sub-pixel and the third sub-pixel, the third light emitting layer may also cover the entire pixel. However, the second light emitting layer may only cover the first sub-pixel and the second sub-pixel, and the charge blocking layer may only cover the second sub-pixel and the third sub-pixel. The first sub-pixel is not limited to display red, the second sub-pixel is not limited to display green and the third sub-pixel is not limited to display blue, as long as the first sub-pixel, the second sub-pixel and the third sub-pixel display different colors, and each displays one of the red, green and blue.

Embodiment Two

In an OLED display panel according to one embodiment of the present disclosure, one pixel of the OLED display panel includes a first sub-pixel displaying red, a second sub-pixel displaying green and a third sub-pixel displaying blue. The OLED display panel sequentially includes:

a first light emitting layer (EML1) covering at least two adjacent sub-pixels including the first sub-pixel and configured to emit red light;

a charge blocking layer (CBL) covering the second sub-pixel and the third sub-pixel;

a second light emitting layer (EML2) covering the first sub-pixel and the second sub-pixel and configured to emit green light;

a third light emitting layer (EML3) covering at least two adjacent sub-pixels including the third sub-pixel and configured to emit blue light.

Figure 5:
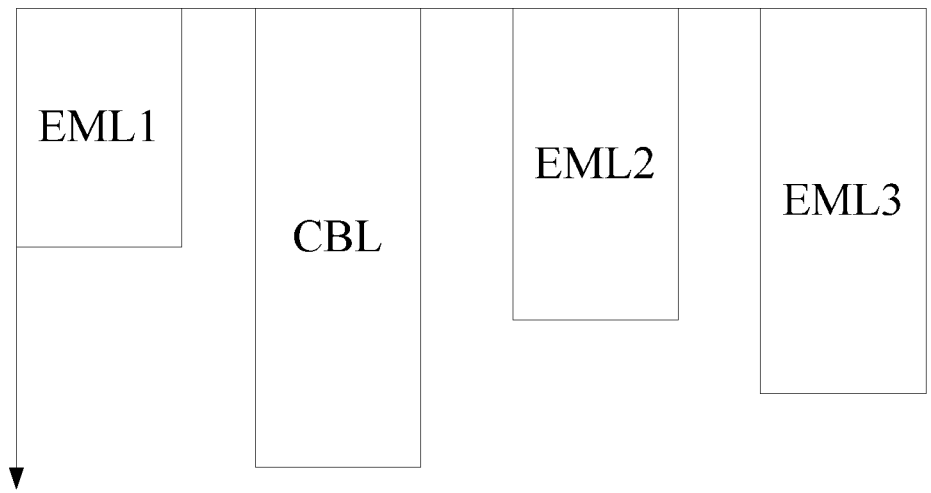
FIG. 5 is a schematic diagram showing HOMO energy levels of each of light emitting layers and a charge blocking layer according to a second embodiment of the present disclosure.

FIG. 5 is a diagram showing HOMO energy levels of each light emitting layer and the charge blocking layer according to the second embodiment of the present disclosure. An arrow direction in FIG. 5 indicates an absolute value of the energy level. Specifically, HOMO energy levels of the first light emitting layer, the second light emitting layer, the third light emitting layer and the charge blocking layer are all negative; the HOMO energy level of the first light emitting layer is higher than that of the second light emitting layer, the HOMO energy level of the second light emitting layer is higher than that of the third light emitting layer, the HOMO energy level of the third light emitting layer is higher than that of the charge blocking layer.

Figure 6:
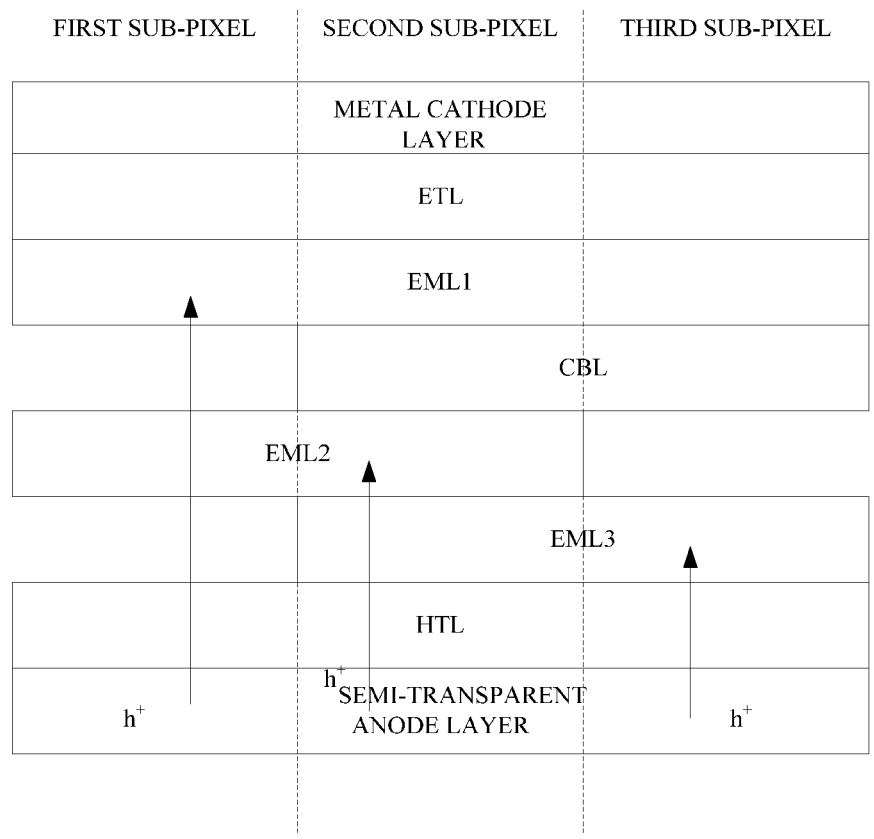
FIG. 6 is a schematic diagram showing an OLED display panel according to the second embodiment of the present disclosure.

Specifically, as shown in FIG. 6, the OLED display panel may include:

a semi-transparent anode layer;

a hole transport layer on the semi-transparent anode layer;

the third light emitting layer on the hole transport layer;

the second light emitting layer on the third light emitting layer;

the charge blocking layer on the second light emitting layer;
the first light emitting layer on the charge blocking layer;
an electron transport layer on the first light emitting layer;
a metal cathode layer on the electron transport layer.

Specifically, a method for manufacturing an OLED display panel according to one embodiment of the present disclosure includes steps of:
forming the semi-transparent anode layer;
forming the hole transport layer on the semi-transparent anode layer;
forming the third light emitting layer on the hole transport layer;
forming the second light emitting layer on the third light emitting layer;
forming the charge blocking layer on the second light emitting layer;
forming the first light emitting layer on the charge blocking layer;
forming the electron transport layer on the first light emitting layer;
forming the metal cathode layer on the electron transport layer.

In the OLED display panel, since the light emitting layer is very thin, holes are more likely to move in a direction from the anode layer to the cathode layer, and are not likely to move transversely in a direction perpendicular to the electric field. The holes are readily to jump from one light emitting layer with a lower HOMO energy level to one light emitting layer with a higher HOMO energy level, and are difficult to jump from one light emitting layer with a higher HOMO energy level to one light emitting layer with a lower HOMO energy level. When a hole remains in one light emitting layer and encounters with an electron, an exciton is formed and light is emitted. In the OLED display panel shown in FIG. 6, for the first sub-pixel region, the holes start from the anode layer. Since the HOMO energy level of the EML2 is lower than that of the EML1, thus the holes may pass through the EML2 to reach EML1, but cannot pass through the ETL, the holes stay in the EML1 to excite the EML1 to emit red light, so that the first sub-pixel displays red light. For the second sub-pixel region, since the HOMO energy level of the EML3 is lower than that of the EML2 and the HOMO energy level of the CBL is lower than that of the EML2, thus the holes may pass through the EML3 to reach EML2, but cannot pass through the CBL, holes stay in the EML2 to excite the EML2 to emit green light, so that the second sub-pixel displays green light. For the third sub-pixel region, since the HOMO energy level of the EML3 is higher than that of the CBL, thus the holes cannot pass through the CBL, holes stay in the EML3 to excite the EML3 to emit blue light, so that the third sub-pixel displays blue light.

When an OLED display panel is manufactured by using FMM in the related art, generally, one FMM opening corresponds to one sub-pixel region, since the accuracy of FMM is limited, thus the pixel density of the OLED display panel is also limited. In the OLED display panel according to one embodiment of the present disclosure, each of the first light emitting layer, the charge blocking layer, the second light emitting layer and the third light emitting layer covers at least two sub-pixels, so that when the light emitting layer is manufactured by using FMM, a minimum opening of the FMM may be at least as large as two sub-pixel regions, thereby enhancing the pixel density of the OLED display panel by twice without changing the FMM. Further, the OLED display panel according to one embodiment of the present disclosure does not rely on an optical effect to extract light of a certain color, so that the luminescent efficiency is not lost, and a color cast problem is not occurred. The OLED display panel according to one embodiment of the present disclosure does not need to change the arrangement sequence of sub-pixels, and thus the screen display is not affected.

Further, the OLED display panel according to one embodiment of the present disclosure is not limited to the structure shown in FIG. 6, instead of covering the entire pixel, the first light emitting layer may also cover only the first sub-pixel and the second sub-pixel; instead of covering the second sub-pixel and the third sub-pixel, the third light emitting layer may also cover the entire pixel. However, the second light emitting layer may only cover the first sub-pixel and the second sub-pixel, and the charge blocking layer may only cover the second sub-pixel and the third sub-pixel. The first sub-pixel is not limited to display red, the second sub-pixel is not limited to display green and the third sub-pixel is not limited to display blue, as long as the first sub-pixel, the second sub-pixel and the third sub-pixel display different colors, and each displays one of the red, green and blue.

The above are optional embodiments of the present disclosure, it should be noted that, several modifications and variations may be made for those of ordinary skill in the art without departing from the principles of the invention, and also should be considered in the scope of the present disclosure.

What is claimed is:

1. An organic light emitting device (OLED) display panel, one pixel of which comprising a first sub-pixel, a second sub-pixel and a third sub-pixel displaying different colors, wherein the OLED display panel sequentially comprises:
a first light emitting layer covering at least two adjacent sub-pixels comprising the first sub-pixel;
a charge blocking layer covering the second sub-pixel and the third sub-pixel;
a second light emitting layer covering the first sub-pixel and the second sub-pixel;
a third light emitting layer covering at least two adjacent sub-pixels comprising the third sub-pixel;
wherein a lowest unoccupied molecular orbital (LUMO) energy level of a main material of the charge blocking layer, a LUMO energy level of a main light emitting material of the third light emitting layer, a LUMO energy level of a main light emitting material of the second light emitting layer and a LUMO energy level of a main light emitting material of the first light emitting layer are sequentially decreased; or, a highest occupied molecular orbital (HOMO) energy level of the main light emitting material of the first light emitting layer, a HOMO energy level of the main light emitting material of the second light emitting layer, a HOMO energy level of the main light emitting material of the third light emitting layer and a HOMO energy level of the main material of the charge blocking layer are sequentially decreased;
wherein the second light emitting layer covers only two sub-pixels including the first sub-pixel and the second sub-pixel; and
the charge blocking layer covers only two sub-pixels including the second sub-pixel and the third sub-pixel.

2. The OLED display panel according to claim 1, wherein the OLED display panel sequentially comprises:
the first light emitting layer covering the entire pixel;
the charge blocking layer covering the second sub-pixel and the third sub-pixel;

the second light emitting layer covering the first sub-pixel and the second sub-pixel;

the third light emitting layer covering the entire pixel.

3. The OLED display panel according to claim 1, wherein the OLED display panel sequentially comprises:

the first light emitting layer covering the entire pixel;
the charge blocking layer covering the second sub-pixel and the third sub-pixel;
the second light emitting layer covering the first sub-pixel and the second sub-pixel;
the third light emitting layer covering the second sub-pixel and the third sub-pixel.

4. The OLED display panel according to claim 1, wherein the OLED display panel sequentially comprises:

the first light emitting layer covering the first sub-pixel and the second sub-pixel;
the charge blocking layer covering the second sub-pixel and the third sub-pixel;
the second light emitting layer covering the first sub-pixel and the second sub-pixel;
the third light emitting layer covering the second sub-pixel and the third sub-pixel.

5. The OLED display panel according to claim 1, wherein the OLED display panel sequentially comprises:

the first light emitting layer covering the first sub-pixel and the second sub-pixel;
the charge blocking layer covering the second sub-pixel and the third sub-pixel;
the second light emitting layer covering the first sub-pixel and the second sub-pixel;
the third light emitting layer covering the entire pixel.

6. The OLED display panel according to claim 1, wherein the OLED display panel comprises:

a semi-transparent anode layer;
a hole transport layer on the semi-transparent anode layer;
the first light emitting layer on the hole transport layer;
the charge blocking layer on the first light emitting layer;
the second light emitting layer on the charge blocking layer;
the third light emitting layer on the second light emitting layer;
an electron transport layer on the third light emitting layer;
a metal cathode layer on the electron transport layer.

7. The OLED display panel according to claim 1, wherein the OLED display panel comprises:

a semi-transparent anode layer;
a hole transport layer on the semi-transparent anode layer;
the third light emitting layer on the hole transport layer;
the second light emitting layer on the third light emitting layer;
the charge blocking layer on the second light emitting layer;
the first light emitting layer on the charge blocking layer;
an electron transport layer on the first light emitting layer;
a metal cathode layer on the electron transport layer.

8. A display device, comprising the OLED display panel according to claim 1.

9. The OLED display panel according to claim 1, wherein the first light emitting layer is at a first side of the charge blocking layer and is in direct contact with a first surface at the first side of the charge blocking layer;

the second light emitting layer is at a second side of the charge blocking layer and is in direct contact with a second surface at the second side of the charge blocking layer;

the first side and the second side are opposite sides of the charge blocking layer;

the third light emitting layer is in direct contact with the second light emitting layer.

10. The OLED display panel according to claim 1, wherein among the first sub-pixel, the second sub-pixel and the third sub-pixel of the pixel, only the second sub-pixel is simultaneously covered by the first light emitting layer, the second light emitting layer and the third light emitting layer.

11. The OLED display panel according to claim 9, wherein the pixel comprises only three sub-pixels including the first sub-pixel, the second sub-pixel and the third sub-pixel.

12. The OLED display panel according to claim 1, wherein among the first sub-pixel, the second sub-pixel and the third sub-pixel of the pixel, only the second sub-pixel is simultaneously covered by the first light emitting layer, the second light emitting layer, the third light emitting layer and the charge blocking layer.

13. A method for manufacturing an organic light emitting device (OLED) display panel having one pixel comprising a first sub-pixel, a second sub-pixel and a third sub-pixel displaying different colors respectively, wherein the method comprises:

forming a first light emitting layer covering at least two adjacent sub-pixels comprising the first sub-pixel;
forming a charge blocking layer covering the second sub-pixel and the third sub-pixel;
forming a second light emitting layer covering the first sub-pixel and the second sub-pixel;
forming a third light emitting layer covering at least two adjacent sub-pixels comprising the third sub-pixel;
wherein a lowest unoccupied molecular orbital (LUMO) energy level of a main material of the charge blocking layer, a LUMO energy level of a main light emitting material of the third light emitting layer, a LUMO energy level of a main light emitting material of the second light emitting layer and a LUMO energy level of a main light emitting material of the first light emitting layer are sequentially decreased; or, a highest occupied molecular orbital (HOMO) energy level of the main light emitting material of the first light emitting layer, a HOMO energy level of the main light emitting material of the second light emitting layer, a HOMO energy level of the main light emitting material of the third light emitting layer and a HOMO energy level of the main material of the charge blocking layer are sequentially decreased;

wherein the forming the charge blocking layer covering the second sub-pixel and the third sub-pixel comprises:
forming the charge blocking layer covering only two sub-pixels including the second sub-pixel and the third sub-pixel.

14. The method according to claim 13, wherein the method comprises:

forming a semi-transparent anode layer;
forming a hole transport layer on the semi-transparent anode layer;
forming the first light emitting layer on the hole transport layer;
forming the charge blocking layer on the first light emitting layer;
forming the second light emitting layer on the charge blocking layer;
forming the third light emitting layer on the second light emitting layer;

forming an electron transport layer on the third light emitting layer;

forming a metal cathode layer on the electron transport layer.

15. The method according to claim 13, wherein the method comprises:

forming a semi-transparent anode layer;

forming a hole transport layer on the semi-transparent anode layer;

forming the third light emitting layer on the hole transport layer;

forming the second light emitting layer on the third light emitting layer;

forming the charge blocking layer on the second light emitting layer;

forming the first light emitting layer on the charge blocking layer;

forming an electron transport layer on the first light emitting layer;

forming a metal cathode layer on the electron transport layer.

16. The method according to claim 13, wherein the forming the second light emitting layer covering the first sub-pixel and the second sub-pixel comprises:

forming the second light emitting layer covering only two sub-pixels including the first sub-pixel and the second sub-pixel.

17. The method according to claim 16, wherein the pixel comprises only three sub-pixels including the first sub-pixel, the second sub-pixel and the third sub-pixel.

18. The method according to claim 13, wherein the forming the charge blocking layer covering the second sub-pixel and the third sub-pixel further comprises: forming the charge blocking layer directly on the first light emitting layer;

wherein the forming the second light emitting layer covering the first sub-pixel and the second sub-pixel comprises: forming the second light emitting layer directly on the charge blocking layer in such a manner that the first light emitting layer and the second light emitting layer are at opposite sides of the charge blocking layer;

wherein the forming the third light emitting layer covering at least two adjacent sub-pixels comprising the third sub-pixel comprises:

forming the third light emitting layer directly on the second light emitting layer.

* * * * *